United States Patent
Zhou

(10) Patent No.: US 12,389,663 B2
(45) Date of Patent: Aug. 12, 2025

(54) METHOD FOR MAKING GATES OF DIFFERENT SIZES WITH DOUBLE PATTERNING TECHNOLOGY

(71) Applicant: Shanghai Huali Integrated Circuit Corporation, Shanghai (CN)

(72) Inventor: Xiaojun Zhou, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 617 days.

(21) Appl. No.: 17/867,261

(22) Filed: Jul. 18, 2022

(65) Prior Publication Data
US 2023/0068888 A1  Mar. 2, 2023

(30) Foreign Application Priority Data
Aug. 24, 2021 (CN) .......................... 202110974170.X

(51) Int. Cl.
| | |
|---|---|
| H10D 84/03 | (2025.01) |
| H01L 21/311 | (2006.01) |
| H01L 21/3213 | (2006.01) |
| H10D 64/01 | (2025.01) |
| H10D 84/01 | (2025.01) |

(52) U.S. Cl.
CPC ..... *H10D 84/038* (2025.01); *H01L 21/31144* (2013.01); *H01L 21/32139* (2013.01); *H10D 64/017* (2025.01); *H10D 84/0142* (2025.01)

(58) Field of Classification Search
CPC ............... H10D 84/038; H10D 64/017; H10D 84/0142; H01L 21/31144; H01L 21/32139; H01L 21/0337; H01L 21/0334; H01L 21/28132
USPC .......................................................... 438/202
See application file for complete search history.

(56) References Cited

U.S. PATENT DOCUMENTS

| | | | |
|---|---|---|---|
| 9,589,958 B1 * | 3/2017 | Kanakasabapathy ....................... H01L 21/3081 |
| 9,679,771 B1 * | 6/2017 | Chen ................... H01L 21/0337 |
| 2010/0112811 A1 * | 5/2010 | Yeh ..................... H10D 84/0172 438/669 |
| 2021/0366777 A1 * | 11/2021 | Lin ....................... H10D 30/62 |

* cited by examiner

*Primary Examiner* — Eva Y Montalvo
*Assistant Examiner* — Kenneth Mark Sipling
(74) *Attorney, Agent, or Firm* — Banner & Witcoff, Ltd.

(57) ABSTRACT

The present application provides a method for making gates of different sizes compatible with the double patterning technology, comprising: forming a plurality of dummy gate structures and spacers on the sidewalls; covering the spacers and a region of large-sized gates with an SOC(silicon-on-carbon) layer; etching the SOC layer to expose the spacers of at least one dummy gate structure; respectively forming the first and the second SOC pattern structures, wherein the first SOC pattern structure covers the spacer of at least one dummy gate structure, and the second SOC pattern structure is disposed in region of the large-sized gates; etching the first SOC pattern structure to form a third SOC pattern structure, one side of the third SOC pattern structure covers one side of the spacer, wherein the other uncovered side of the spacer is used to define one side of the gate of medium-sized width.

5 Claims, 5 Drawing Sheets step 1, providing a substrate, forming a first polysilicon layer on the substrate, forming a hard mask layer on the first polysilicon layer, forming a silicon oxide layer on the hard mask layer, forming a second polysilicon layer on the silicon oxide layer, configuring a region of small-sized gates, and patterning the second polysilicon layer in the region of small-sized gates to form a plurality of dummy gate structures;

step 2, defining a minimum width of one of the small-sized gates, and forming spacers on sidewalls of each of the plurality of dummy gate structures, wherein a width of the spacer is configured to be the minimum width of one of the small-sized gates;

step 3, removing the plurality of dummy gate structures;

step 4, configuring a region of large-sized gates, and spin-coating an SOC layer to cover the spacers of the small-sized gate region and cover the large-sized gate region;

step 5, etching the SOC layer and the silicon oxide layer, wherein the etching stops at an upper surface of the hard mask layer, exposing the spacers of each one of the plurality of dummy gate structures, wherein the post etching SOC layer respectively forms a first SOC pattern structure and a second SOC pattern structure, wherein the first SOC pattern structure covers the two spacers of each one of the plurality of dummy gate structures, wherein the second SOC pattern structure is configured to be in the region of large-sized gates, and wherein a width of the second SOC pattern structure is configured to a width of one of the large-sized gates;

step 6, providing a photomask comprising a medium-sized gate width for the small-sized gates, wherein the medium-sized gate width is in a range between a small-sized gate width and the large-sized gate width; and performing photolithography and etching on the first SOC pattern structure by applying the photomask, wherein a third SOC pattern structure is formed after the etching, wherein one side of the third SOC pattern structure covers one side of one of the spacers of each one of the plurality of dummy gate structures, the other side of the spacer not covered by the third SOC pattern structure is configured to define one side of the gate with the medium-sized width, and wherein an outer side of the third SOC pattern structure is configured to define another side of the gate with the medium-sized width;

step 7, etching the hard mask layer to form a hard mask pattern, with the spacer exposed from step 5, the outer side of the third SOC pattern structure in step 6, the other side of the spacer abutting the third SOC pattern structure, and sidewalls of the second SOC pattern structure;

step 8, etching the first polysilicon layer masked by the sidewalls of the hard mask pattern, to form the gates with the minimum width, the medium-sized width, and the large-sized width.

FIG. 10

METHOD FOR MAKING GATES OF DIFFERENT SIZES WITH DOUBLE PATTERNING TECHNOLOGY

CROSS-REFERENCES TO RELATED APPLICATIONS

This application claims the priority to Chinese patent application No. CN202110974170.X, filed on Aug. 24, 2021 at CNIPA, and entitled "METHOD FOR MAKING GATES OF DIFFERENT SIZES WITH DOUBLE PATTERNING TECHNOLOGY", the disclosure of which is incorporated herein by reference in entirety.

TECHNICAL FIELD

The present application relates to the technical field of semiconductor IC chips, in particular to a method for fabricating gates of different sizes with the double patterning technology.

BACKGROUND

With the demands from user requirements for electronic products performance following the Moore's Law, integration level of transistors has become increasingly high, resulting in increasingly narrow gate width. Meanwhile, the manufacturing technologies have developed from single exposure mode to multiple exposures, such as the self-aligned double-patterning (SADP) and some other technologies. Based on the current available SADP technology, usually gates at the critical dimensions have only the same width gate of critical dimension. To expand the width sizes of different gates, it is necessary to introduce additional masks.

However with the current process technology, gates of critical dimension it becomes necessary to add additional different masks for gates of the critical dimensions, which is time-consuming and costly in the production process.

BRIEF SUMMARY

The present application provides a method for making gates of different sizes in the double patterning technology, therefore save time and reduce cost in forming gates of different sizes.

The method for making gates of different sizes compatible with the double patterning technology, at least includes:

step 1, providing a substrate, forming a first polysilicon layer on the substrate, forming a hard mask layer on the first polysilicon layer, forming an oxide layer on the hard mask layer, forming a second polysilicon layer on the silicon oxide layer, defining a critical dimension gate region, and patterning the second polysilicon layer to form a plurality of dummy gate structures, wherein the gate structures have the critical dimensions;

step 2, defining a gate minimum width at the critical dimension of the gates, and forming spacers on sidewalls of each dummy gate structure, wherein the width of each spacer is equal to the minimum gate width of the gate at the critical dimension;

step 3, removing the dummy gate structure;

step 4, defining a larger gate (a gate not of the critical dimension) region, and spin-coating an silicon-on-carbon (SOC) layer to cover the spacers of the small-sized gates and cover the large-sized gates, here the small-sized gates refer to gates at the critical dimension of the process, while the large-sized gates refer to gates at the non-critical dimension of the process;

step 5, etching the SOC layer and the oxide layer, the etching stops at the upper surface of the hard mask layer, so as to expose the two spacers of at both sides of the dummy gate structures, wherein the etched SOC layer separately forms a first SOC pattern structure and a second SOC pattern structure, the first SOC pattern structure covers the two spacers of the dummy gate structures, the second SOC pattern structure is located in the large-sized gate region, and the width of the second SOC pattern structure is equal to the width of a large-sized gate;

step 6, providing a mask defining a medium-sized gate width, herein the medium-sized width is greater than the minimum gate width and less than the width of the large-sized gate, and performing photolithography and etching on the first SOC pattern structure by means of the mask, wherein a third SOC pattern structure is formed after the etching, one side of the third SOC pattern structure covers one side of the spacer, the other side of the spacer not covered by the third SOC pattern structure is used to define one side of a gate with the medium-sized width, and an outer side of the third SOC pattern structure is used to define the other side of the gate with the medium-sized width;

step 7, etching the hard mask layer to form a hard mask pattern, along the spacer exposed in step 5, the outer side of the third SOC pattern structure in step 6, the other side of the spacer abutting the third SOC pattern structure, and sidewalls of the second SOC pattern structure; and step 8, etching the first polysilicon layer along sidewalls of the hard mask pattern, so as to form gate structures with the minimum gate width, the medium-sized gate width, and the large-sized gate width.

In an example, the hard mask layer in step 1 is silicon nitride.

In an example, the method of forming the spacer on the sidewalls of the dummy gate structure in step 2 is: first depositing a silicon nitride layer covering the dummy gate structure, and then etching back the silicon nitride layer to form the spacer on the sidewalls of the dummy gate structure.

In an example, after the first SOC pattern structure is etched in step 6, the oxide layer below the first SOC pattern structure is also etched, and the hard mask layer is an etch stop layer.

In an example, after the gate structures are formed by etching in step 8, the hard mask pattern is removed.

As stated above, the method for making gates of different sizes compatible double patterning technology has the following benefits: the present application meets the requirements for having different sized gates at the critical dimensions by adjusting the gate width in a double self-aligned process, combining the region of the small-sized gates at critical dimension, the region of the medium-sized gates, and the region of larger-sized gates which are not of the critical dimensions, by adding a new mask to define small-sized gates with medium-sized width, thus saving s masks and process time from the existing process.

BRIEF DESCRIPTION OF THE DRAWINGS

FIG. 10 is a flowchart of a method for making gates of different sizes based on a double patterning technology of the present application.

DETAILED DESCRIPTION OF THE DISCLOSURE

The embodiments of the present application are described below using specific examples, and those skilled in the art can easily understand other advantages and effects of the present application from the contents disclosed in the Description. The present application can also be implemented or applied using other different specific embodiments, and various details in the Description can also be modified or changed based on different viewpoints and applications without departing from the spirit of the present application.

Referring to FIGS. 1-10. It should be noted that the drawings provided in this embodiment are only used to illustrate the basic concept of the present application in a schematic way, so the drawings only show the components related to the present application rather than being drawn according to the number, shape and size of the components in actual implementation. The type, number and proportion of various components can be changed randomly during actual implementation, and the layout of components may be more complicated.

The present application provides a method for making gates of different sizes based on a double patterning technology. Referring to FIG. 10, FIG. 10 is a flowchart of the method for making gates of different sizes based on a double patterning technology of the present application. The method at least includes the following steps.

Figure 1:
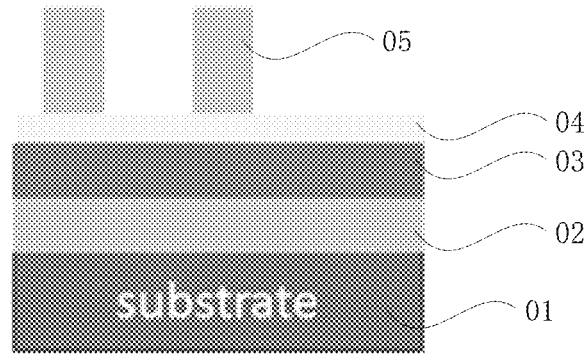
FIG. 1 is a schematic diagram of a structure formed after a dummy gate structure is formed in step 1 according to the present application.

Step 1, providing a substrate, forming a first polysilicon layer on the substrate, forming a hard mask layer on the first polysilicon layer, forming an oxide layer on the hard mask layer, forming a second polysilicon layer on the silicon oxide layer, defining a smaller-gate region, and patterning the second polysilicon layer in the smaller-gate region to form a plurality of dummy gate structures. Referring to FIG. 1. FIG. 1 is a schematic diagram of a structure formed after forming the dummy gate structure in step 1 of the present application. In step 1, the first polysilicon layer 02 is formed on the substrate 01, the hard mask layer 03 is formed on the first polysilicon layer 02, the oxide layer 04 is formed on the hard mask layer 03, the second polysilicon layer is formed on the silicon oxide layer 04, the small-sized gate region (gate region with gate of the minimum width at the critical dimension) is defined as a region on the upper surface of the second polysilicon layer, and the second polysilicon layer in the small-sized gate region is patterned to form a plurality of dummy gate structures 05.

In this embodiment of the present application, the hard mask layer 03 in step 1 is made of silicon nitride.

Figure 2:
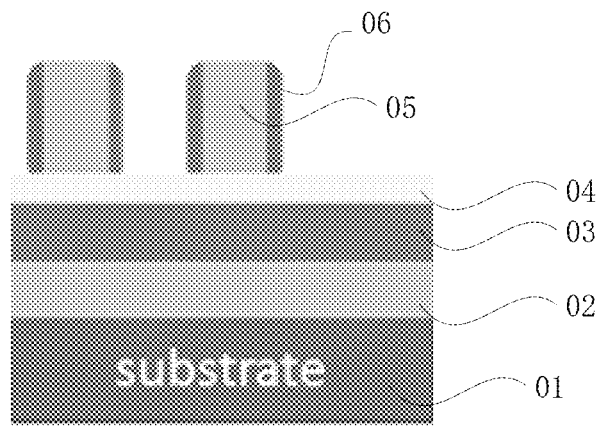
FIG. 2 is a schematic diagram of a structure formed after spacers are formed on sidewalls of the dummy gate structure according to the present application.

Step 2. A minimum width of a small-sized gate is defined, and a spacer is formed on sidewalls of each dummy gate structure 05, wherein the width of the spacer is equal to the minimum width of the gate of critical dimension. Referring to FIG. 2, FIG. 2 is a schematic diagram of a structure formed after the spacers are formed on the sidewalls of the dummy gate structure 05 in the present application. In step 2, the minimum width of the small-sized gate is defined, and the spacer 06 is formed on the sidewalls of each dummy gate structure 05, wherein the width of the spacer 06 is equal to the minimum width of the small-sized gate.

In this embodiment of the present application, the method of forming the spacer on the sidewalls of the dummy gate structure in step 2 is: first depositing a silicon nitride layer covering the dummy gate structure 05, and then etching back the silicon nitride layer to form the spacers 06 on the sidewalls of the dummy gate structure.

Figure 3:
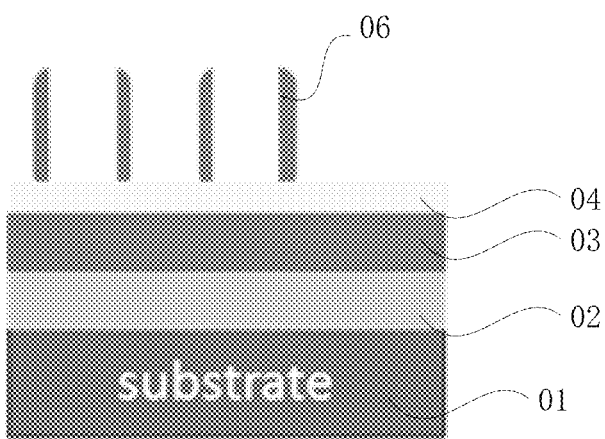
FIG. 3 is a schematic diagram of a structure formed after the dummy gate structure is removed according to the present application.

Step 3. The dummy gate structure is removed. Referring to FIG. 3, FIG. 3 is a schematic diagram of a structure formed after the dummy gate structure is removed in the present application. In step 3, the spacers are retained as the dummy gate structure is removed, and each dummy gate structure of the plurality of dummy gate structures has two spacers 06.

Figure 4:
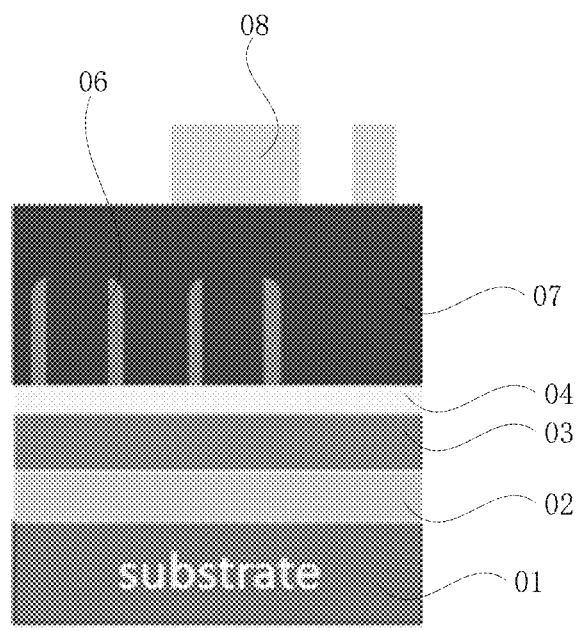
FIG. 4 is a schematic diagram of a structure formed after an SOC layer is applied according to the present application.

Step 4. A large-sized gate region is defined, and an SOC layer is spin-coated to cover the spacer of the small-sized gate region and cover the large-sized gate region. Referring to FIG. 4, FIG. 4 is a schematic diagram of a structure formed after the SOC layer is applied in the present application. In step 4, the large-sized gate region is defined, and the SOC layer 07 is spin-coated to cover the spacers 06 of the small-sized gate region and to cover the large-sized gate region.

Step 5. The SOC layer and the oxide layer are etched, the etching stops at the upper surface of the hard mask layer, so as to expose spacers of the dummy gate structures, wherein the post etching SOC layer forms a first SOC pattern structure and a second SOC pattern structure respectively, the first SOC pattern structure covers the two spacers of each of the dummy gate structures, the second SOC pattern structure is located in the large-sized gate region, and the width of the second SOC pattern structure is equal to the width of a large-sized gate.

Figure 5:
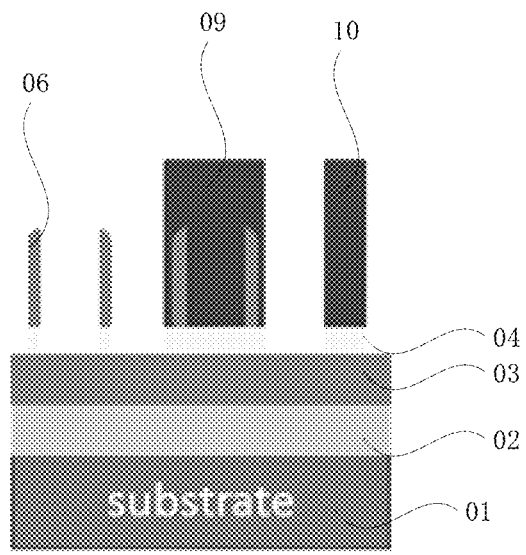
FIG. 5 is a schematic diagram of a structure formed after first and second SOC pattern structures are formed according to the present application.

Referring to FIG. 5, FIG. 5 is a schematic diagram of a structure formed after the first and second SOC pattern structures are formed in the present application. In step 5, the SOC layer and the oxide layer are etched, the etching stopping at the upper surface of the hard mask layer, and a photoresist pattern 08 as shown in FIG. 4 is formed on the SOC layer 07 before the etching. Referring to FIG. 5, two spacers 06 of each of the dummy gate structures are exposed after the etching, the post etcing SOC layer forms the first SOC pattern structure 09 and the second SOC pattern structure 10 respectively, the first SOC pattern structure 09 covers the two spacers of each of the dummy gate structures, and the second SOC pattern structure 10 is located in the large-sized gate region, and the width of the second SOC pattern structure 10 is equal to the width of a large-sized gate.

Step 6. A mask with a medium-sized width of the small-sized gate is provided, herein the medium-sized width has a dimension between the minimum width and the width of the large-sized gate. Patterning including photolithography and etching is performed on the first SOC pattern structure with the help of the mask. Then a third SOC pattern structure is formed after the patterning, herein one side of the third SOC pattern structure covers one side of one spacer, the other side of the spacer not covered by the third SOC pattern structure is used to define one side of a gate with the medium-sized width, and an outer side of the third SOC pattern structure is used to define the other side of the gate with the medium-sized width.

Figure 6:
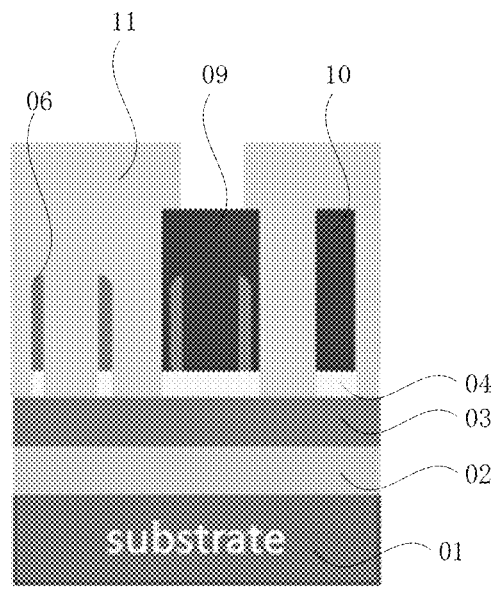
FIG. 6 is a schematic diagram of a structure formed after a gate with a medium-sized width is defined according to the present application.
Figure 7:
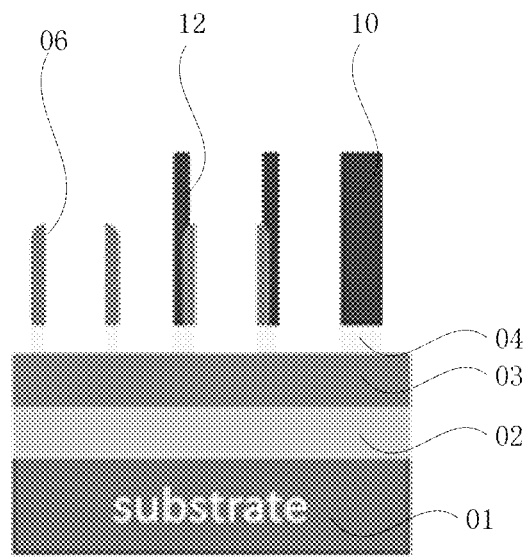
FIG. 7 is a schematic diagram of a structure formed after a third SOC pattern structure is formed according to the present application.

Referring to FIG. 6 and FIG. 7, FIG. 6 is a schematic diagram of a structure formed after the gate with the medium-sized smaller width is defined in the present application, and FIG. 7 is a schematic diagram of a structure formed after the third SOC pattern structure is formed in the present application. In step 6, the mask defined with the medium-sized width of the small-sized gate is provided, the medium-sized width has a dimension between the minimum width and the width of the large-sized gate, and the photolithography and etching are performed on the first SOC pattern structure by using the mask. During the photolithography, a photoresist pattern 11 as shown in FIG. 6 is formed. The first SOC pattern structure 09 is etched vertically down in the photoresist pattern 11, and the third SOC pattern structure 12 as shown in FIG. 7 is formed after the etching. One side of the third SOC pattern structure 12 covers one side of the spacer 06, and the other side of the spacer not covered by the third SOC pattern structure 12 is used to define one side of the spacer (i.e., one side of the spacer 06 abutting the third SOC pattern structure) of a gate with the medium-sized width. An outer side of the third SOC pattern structure 12 is used to define the other side of the gate with the medium-sized width.

In this embodiment of the present application, after the first SOC pattern structure 09 is etched in step 6, the oxide layer 04 below the first SOC pattern structure 09 is also etched, with the hard mask layer 03 acting as an etch stop layer.

Figure 8:
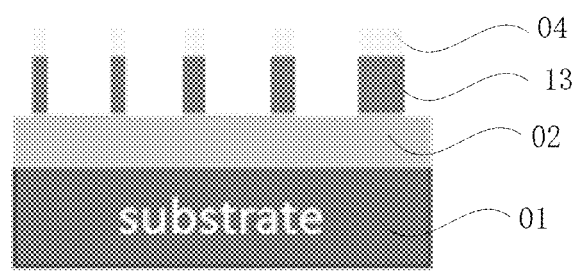
FIG. 8 is a schematic diagram of a structure formed after a hard mask layer is etched to form a hard mask pattern according to the present application.

Step 7. Along the spacer exposed in step 5, the outer side of the third SOC pattern structure in step 6, the other side of the spacer abutting the third SOC pattern structure, and a side walls of the second SOC pattern structure, the hard mask layer 03 is etched to form a hard mask pattern. Referring to FIG. 8, FIG. 8 is a schematic diagram of a structure formed after the hard mask layer is etched to form a hard mask pattern in the present application. In step 7, along the spacer 06 (i.e., the spacer defining the minimum width of the gate of critical dimension) exposed in step 5, the outer side of the third SOC pattern structure 12 in step 6, the other side of the spacer abutting the third SOC pattern structure 12, and the sidewalls of the second SOC pattern structure 10, the hard mask layer 03 is etched to form the hard mask pattern 13.

Figure 9:
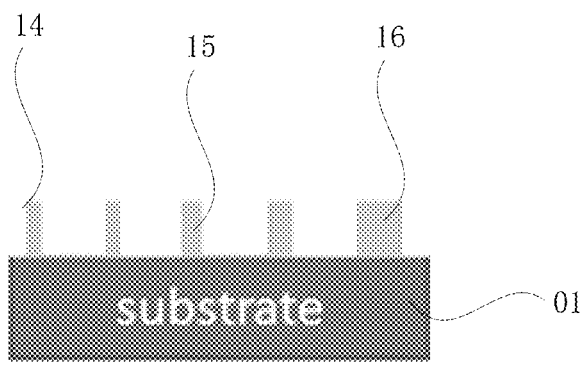
FIG. 9 is a schematic diagram of a structure formed after a first polysilicon layer is etched according to the present application.

Step 8. The first polysilicon layer is etched outside the sidewalls of the hard mask pattern, so as to form gate structures with the minimum width, the medium-sized width, and the large-sized gate width at the same time. Referring to FIG. 9, FIG. 9 is a schematic diagram of a structure formed after the first polysilicon layer is etched in the present application. In step 8, the first polysilicon layer 02 is etched outside the sidewalls of the hard mask pattern 13, so as to form the gate structure 14 with the minimum width, the gate structure 15 with the medium-sized width, and the gate structure 16 with the large-sized gate width.

In this embodiment of the present application, after the gate structures are formed by etching in step 8, the hard mask pattern is removed.

To sum up, the present application meets the requirements for making gates of different sizes by adjusting the gate width in a self-aligned double-patterning process, merging the small-sized gate region with a medium-sized width and a large-sized gate region, by adding a new mask to define a small-sized gate with the relatively small width, thus saving other masks and process time, a process improvement from the existing technique. Therefore, the present application may overcome shortcomings in current method and offer high industrial utilization value.

The above embodiment merely illustrates the principle and effect of the present application, rather than limiting it. Anyone skilled in the art can modify or change the above embodiment without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A method for making gates of different sizes, comprising:
    step 1, providing a substrate, forming a first polysilicon layer on the substrate, forming a hard mask layer on the first polysilicon layer, forming a silicon oxide layer on the hard mask layer, forming a second polysilicon layer on the silicon oxide layer, configuring a region of small-sized gates, and patterning the second polysilicon layer in the region of small-sized gates to form a plurality of dummy gate structures;
    step 2, defining a minimum width of one of the small-sized gates, and forming spacers on sidewalls of each of the plurality of dummy gate structures, wherein a width of the spacer is configured to be the minimum width of one of the small-sized gates;
    step 3, removing the plurality of dummy gate structures;
    step 4, configuring a region of large-sized gates, and spin-coating a silicon-on-carbon (SOC) layer to cover the spacers of the region of small-sized gates and cover the region of large-sized gates;
    step 5, etching the SOC layer and the silicon oxide layer, wherein the etching stops at an upper surface of the hard mask layer, exposing the spacers of each one of the plurality of dummy gate structures, wherein the post etching SOC layer forms a first SOC pattern structure and a second SOC pattern structure, wherein the first SOC pattern structure covers two spacers of each one of the plurality of dummy gate structures, wherein the second SOC pattern structure is configured to be in the region of large-sized gates, and wherein a width of the second SOC pattern structure is configured to a width of one of the large-sized gates;
    step 6, providing a photomask comprising a medium-sized gate width for the small-sized gates, wherein the medium-sized gate width is in a range between a small-sized gate width and the width of the one of the large-sized gates; and performing photolithography and etching on the first SOC pattern structure by applying the photomask, wherein a third SOC pattern structure is formed after the etching, wherein one side of the third SOC pattern structure covers one side of one of the spacers of each one of the plurality of dummy gate structures, the other side of the spacer not covered by the third SOC pattern structure is configured to define one side of the gate with the medium-sized gate width, and wherein an outer side of the third SOC pattern structure is configured to define another side of the gate with the medium-sized gate width;

step 7, etching the hard mask layer to form a hard mask pattern, with the spacer exposed from step 5, the outer side of the third SOC pattern structure in step 6, the other side of the spacer abutting the third SOC pattern structure, and sidewalls of the second SOC pattern structure; and step 8, etching the first polysilicon layer masked by the sidewalls of the hard mask pattern, to form the gates with the minimum width, the medium-sized gate width, and the width of the one of the large-sized gates.

2. The method for making gates of different sizes according to claim 1, wherein the hard mask layer in step 1 comprises silicon nitride.

3. The method for making gates of different sizes according to claim 1, wherein the forming the spacers on the sidewalls of the plurality of dummy gate structures in step 2 further comprises: first depositing a silicon nitride layer covering the plurality of dummy gate structures, and then etching back the silicon nitride layer to form the spacers on the sidewalls of the plurality of dummy gate structures.

4. The method for making gates of different sizes according to claim 1, wherein after the first SOC pattern structure is etched in step 6, the silicon oxide layer below the first SOC pattern structure is also etched, and wherein the hard mask layer serves as an etch stop layer.

5. The method for making gates of different sizes according to claim 1, wherein after the gates are formed by etching in step 8, the hard mask pattern is removed.

* * * * *